United States Patent [19]

Kitaura

[11] 4,132,985

[45] Jan. 2, 1979

[54] AUTOMATIC CONTROL DEVICE FOR CAMERAS

[75] Inventor: Mashio Kitaura, Osaka, Japan

[73] Assignee: Minolta Camera Kabushiki Kaisha, Osaka, Japan

[21] Appl. No.: 652,548

[22] Filed: Jan. 26, 1976

Related U.S. Application Data

[62] Division of Ser. No. 385,279, Aug. 3, 1973, Pat. No. 3,988,069.

[51] Int. Cl.² .............................................. H03K 13/03
[52] U.S. Cl. ........................... 340/347 AD; 354/23 D; 356/218
[58] Field of Search ................... 340/347 M, 347 AD; 356/218, 219, 223; 354/23 D

[56] References Cited

U.S. PATENT DOCUMENTS

| 3,124,794 | 3/1964 | Patmore | 340/347 M |
| 3,553,443 | 1/1971 | Neil | 340/347 M |
| 3,807,879 | 4/1974 | Mori | 354/23 D |

Primary Examiner—Charles D. Miller
Attorney, Agent, or Firm—Staas & Halsey

[57] ABSTRACT

This invention relates to an automatic camera exposure control device comprising a first light measuring circuit including a photoelectric element receiving light through the objective lens of the camera and generating a first output proportional to the logarithm of the brightness of an object to be photographed, and a circuit for providing a second output indicative of the film sensitivity and the lens aperture value, the light measuring circuit for providing a first signal indicative of the sum of the first and second outputs and a second circuit including a pulse genrator circuit for generating clock pulses and a counter for counting the clock pulses and for producing a second signal of a stairstep waveform corresponding to the counting of a pulse; a voltage comparator circuit for comparing the second signal with the first signal and for producing a signal when the level of the second signal exceeds that of the first signal; a third circuit composed mainly of a gate circuit for stopping the counting of the pulse upon receipt of the threshold level signal from the voltage comparator circuit; and a shutter control circuit including a transistor for inverse logarithmic conversion and for producing a collector current proportional to the exponent of the second signal applied to its base, and a capacitor to be charged by the collector current of the transistor and a switching circuit responsive to the voltage charged in the capacitor in excess of a predetermined level for actuating the shutter to terminate the exposure interval.

5 Claims, 19 Drawing Figures

Logarithmic Value of Illumination on the Light Receiving Face, (Log E)

Illumination on the light receiving face (log E)
(log Scale)

Brightness of the object (log Scale)

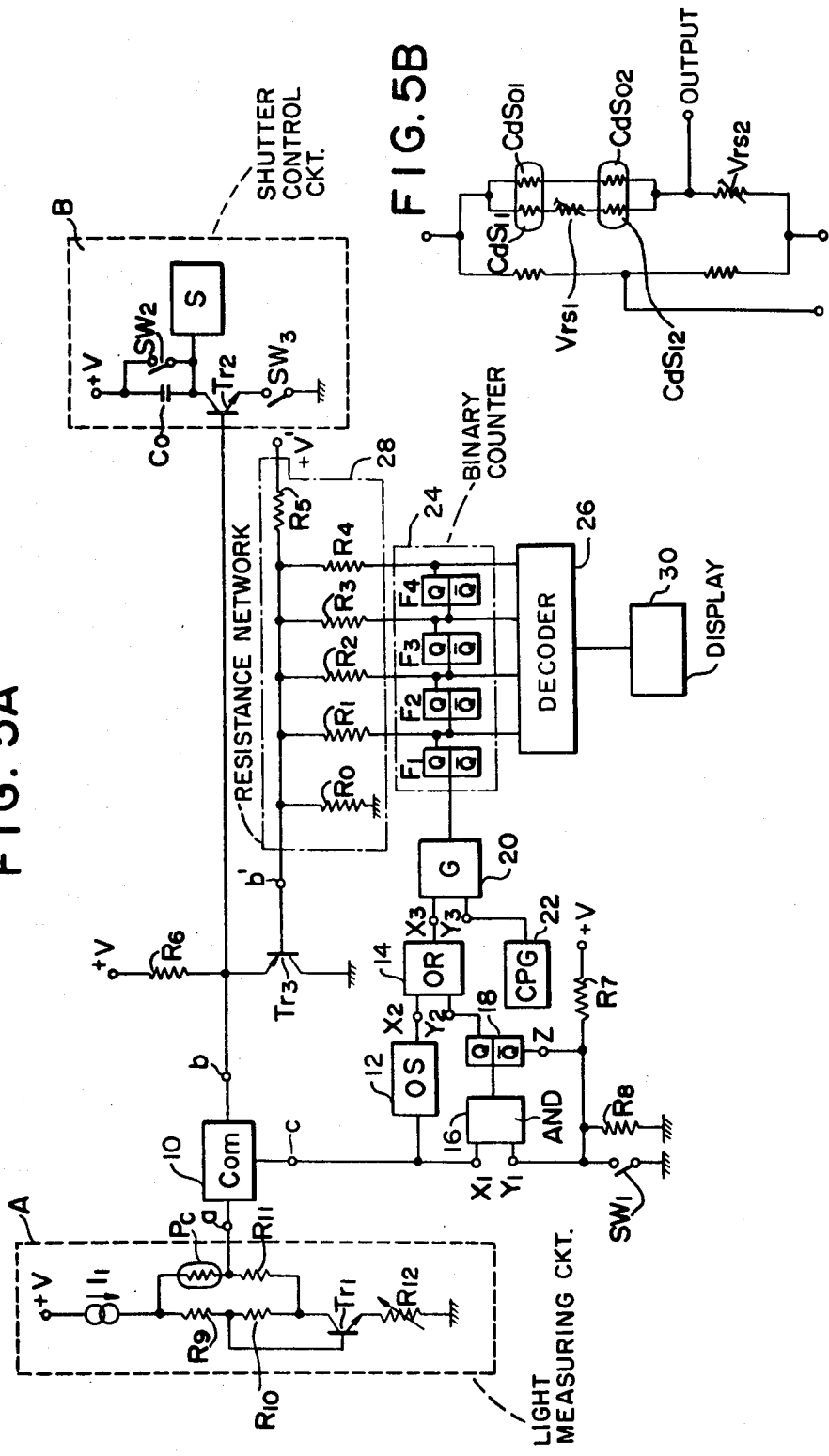

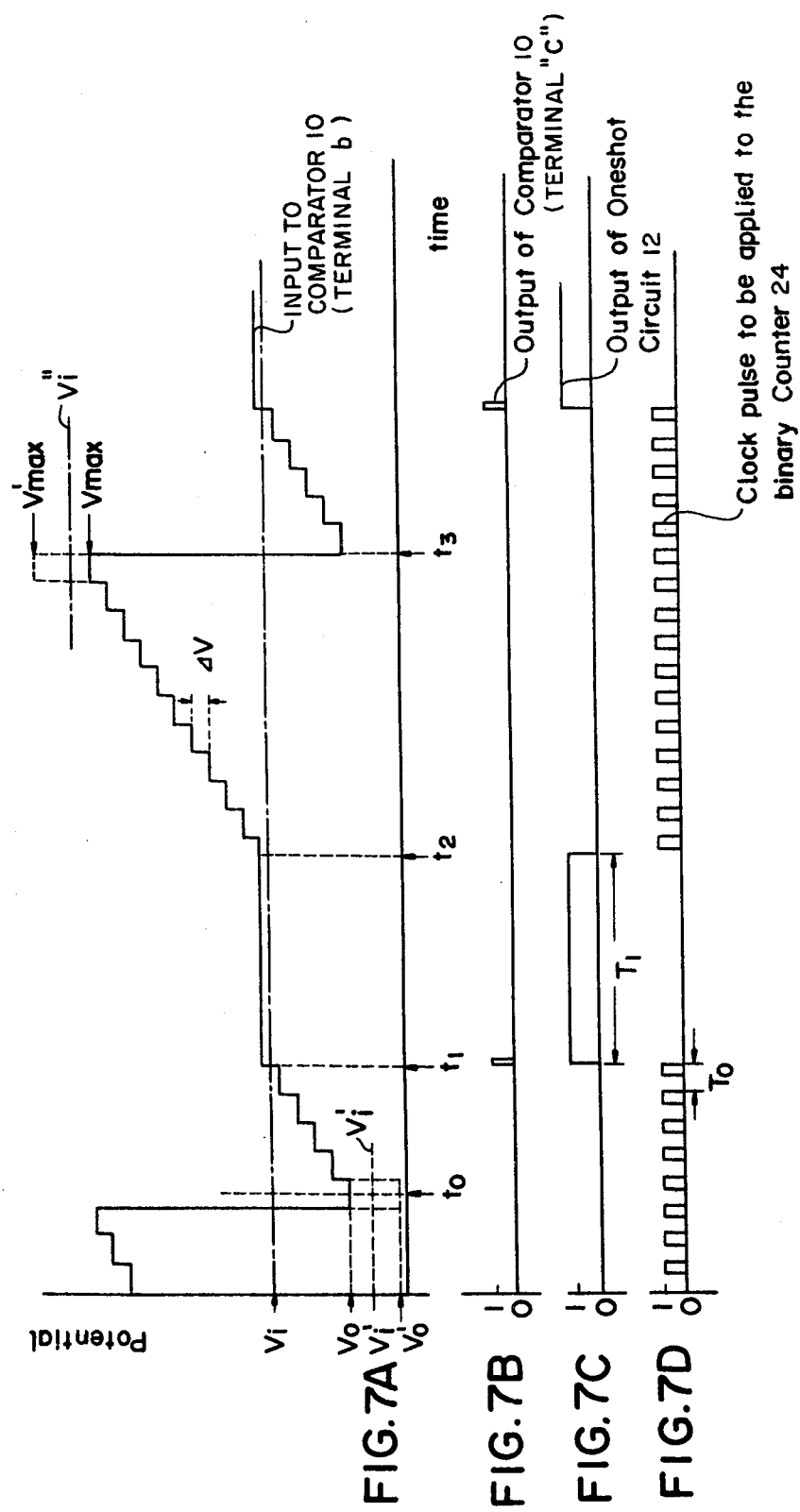

AUTOMATIC CONTROL DEVICE FOR CAMERAS

REFERENCE TO CO-PENDING APPLICATION

This is a division of application Ser. No. 385,279, filed Aug. 3, 1973 now U.S. Pat. No. 3,988,069.

Reference is made to co-pending application Ser. No. 131,151, now refiled as application Ser. No. 315,211 by the inventor of this invention and assigned to the assignee of this invention.

BACKGROUND OF THE INVENTION

FIELD OF THE INVENTION

This invention relates to improvements in or relating to an electrical exposure control device for cameras of the so-called through-the-lens-type light measuring system for measuring the brightness of an object to be photographed through a photographing lens of the camera.

DESCRIPTION OF THE PRIOR ART

Hitherto, an electrical exposure control device for the camera of a through-the-lens-type light measuring system in which an output of its light measuring circuit derived immediately before the operation of a shutter is memorized in a digital form during the shutter operation. As a result, the exposure time is automatically controlled in accordance with the memorized value, has been proposed in the art, as disclosed, for example, in the Japanese Patent Publication No. 4903/1970. Namely, in the device set forth in the above-identified patent publication, a pulse generator circuit provides a pulse whose frequency varies with the brightness of an object to be photographed. The pulse is counted by a counter for a certain period of time; the brightness of the object is converted into a digital value and stored; and the exposure time is controlled in accordance with the stored content. However, it is extremely difficult to obtain a pulse generator circuit whose frequency linearly varies over a wide range of radiation intensity values, and consequently the aforesaid device is not practical. Further, there has also been proposed such a device which employs a pulse generator circuit of a constant frequency and in which a pulse derived therefrom is applied to a time constant circuit consisting of a photoelectric element and a capacitor; the time for the capacitor to be charged up to a predetermined level is counted and the counted content is utilized for determining the exposure time (refer to, for example, U.S. Pat. No. 3,703,130 or Deutch OS No. 2,114,525). With this device, the time period for measuring the quantity of light varies with the brightness of an object to be photographed and becomes long especially where the object is dimly illuminated. Thus, there arises various problems in the construction and operation of such a device. In both of the above devices, where a flip-flop circuit is used as the counter, it is necessary to employ at least the same number of flip-flop circuits as the stages for setting the exposure time. This introduces complexity in the circuit construction and requires many switches for actuating the circuits, which also results in complicated circuit construction.

Further, the indication of the exposure time of the automatic exposure setting provided for the camera operator is achieved by a meter and is confirmed by the position of a pointer of the meter whether the brightness of the object to be photographed falls inside or outside of a photographable range. However, the indication by such an indicator is an analog one, so that the recognition of the information being indicated may be difficult. In addition, the meter does not readily withstand mechanical shocks and hence, is likely to be broken. Moreover, an indicator is known for indicating the exposure time by a meter and for giving warning by turning on and off a lamp or the like when the brightness of the object is outside of the characteristic range in which a light receiving element is capable of measuring the light. However, this indicator requires two kinds of indicating sections, and there are problems of recognizing these separate indications, and of the susceptibility to the influence of mechanical shocks.

SUMMARY OF THE INVENTION

One object of this invention is to provide an automatic exposure control device for cameras which is free from the aforesaid defects experienced in the prior art and which indicates the exposure time in a digital form.

Another object of this invention is to provide an automatic exposure control device which employs a pulse generator circuit of constant frequency, is capable of measuring the light in a very short time, provides a highly accurate control of the exposure time over a wide range of levels of object illumination, and is simple in circuit construction.

Still another object of this invention is to provide an automatic exposure control device in which a required number of light-emitting indicator units for digital indication is continuously and sequentially caused to emit light to give a warning indication.

In accordance with these and other objects, this invention relates to an automatic camera exposure control device comprising a light measuring circuit including a photoelectric element receiving light through the objective lens of the camera and generating a first output proportional to the logarithm of the brightness of an object to be photographed, and a circuit for providing a second output indicative of the film sensitivity and the lens aperture value, the light measuring circuit for providing a first signal indicative of the sum of the first and second outputs; and a second circuit including a pulse generator circuit for generating clock pulses and a counter for counting the clock pulses and for producing a second signal of a stairstep waveform corresponding to the counting of a pulse; and a voltage comparator circuit for comparing the second signal with the first signal and for producing a signal when the level of the second signal exceeds that of the first signal; a third circuit composed mainly of a gate circuit for stopping the counting of the pulse upon receipt of the threshold level signal from the voltage comparator circuit; and a shutter control circuit including a transistor for inverse logarithmic conversion and for producing a collector current proportional to the exponent of the second signal applied to its base and a capacitor to be charged by the collector current of the transistor and a switching circuit responsive to the voltage charged in the capacitor in excess of a predetermined level for actuating the shutter to terminate the exposure interval.

BRIEF DESCRIPTION OF THE DRAWINGS

This invention will readily be understood by reference to the following detailed description and to the accompanying drawings, in which:

FIG. 5A is an electric circuit diagram of one example of this invention;

FIG. 5B illustrates one example of a circuit of a compound photoelectric element employed in the example of FIG. 5A;

FIGS. 7A, 7B, 7C and 7D, inclusive, are timing charts, for explaining the operation of the example depicted in FIG. 5A;

FIG. 11 shows the case where the circuit of FIG. 10 conducts additive counting, FIG. 12 illustrates the case where the circuit of FIG. 10 conducts subtractive counting, FIG. 13A demonstrates the level at a terminal b in the circuit of FIG. 10 when the terminal a is at a level Vi, and FIG. 13B shows the level at an input terminal X of a counter B in FIG. 10 at that time.

DESCRIPTION OF THE PREFERRED EMBODIMENTS

This invention is directed to improvements in or relating to the exposure time control device proposed in our above-identified U.S. Pat. Application Ser. No. 131,151, now refiled as Ser. No. 315,211. A brief description will be given first in connection with the invention proposed by the above-identified application.

Figure 1:
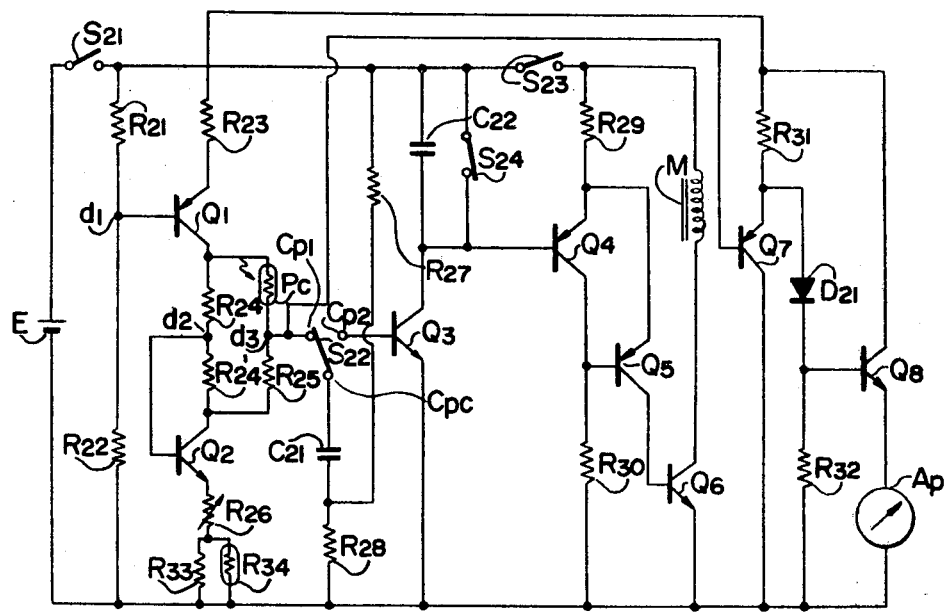
FIG. 1 is an electric circuit diagram of a camera exposure time control device previously proposed by the present applicant.
Figure 2:
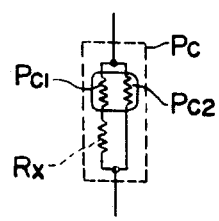
FIG. 2 is a detailed electric circuit diagram of a compound photoelectric element employed in the circuit of FIG. 1.
Figure 3:
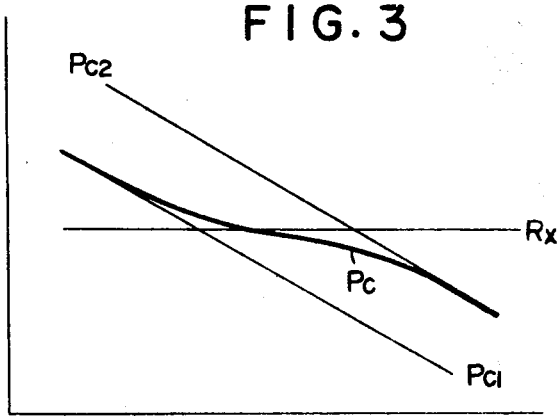
FIG. 3 is a graph showing the resistance characteristic of the compound photoelectric element as a function of the logarithmic value of the incident illumination on the light receiving face of the photoelectric element.
Figure 4:
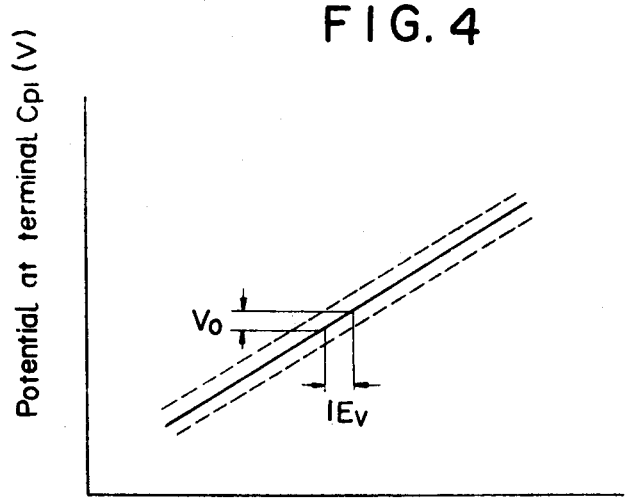
FIG. 4 is a graph showing the relationship between the potential at a terminal $C_{p1}$ in FIG. 1 and the illumination on the light receiving face of the compound photoelectric element.

FIGS. 1 to 4 are explanatory of the invention disclosed in the above application, FIG. 1 being its electric circuit diagram, FIG. 2 a detailed electric circuit diagram of a compound photoelectric element employed in the circuit of FIG. 1, FIG. 3 a graph showing the relationship between the resistance characteristic of the compound photoelectric element to a logarithmic value of the illumination on its light receiving face and FIG. 4 a graph showing the relationship between the potential at a terminal $C_{p1}$ in the circuit of FIG. 1 and the illumination incident on the light receiving face of the photoelectric element.

In FIG. 1, resistors $R_{21}$ and $R_{22}$ are connected in series to a power source E through a power source switch $S_{21}$ and their connection point is connected to the base of a first stage compensating transistor $Q_1$. Between the collectors of the transistor $Q_1$ and of a second stage compensating transistor $Q_2$, there are inserted in series a compound photoelectric element Pc and a resistor $R_{25}$ connected in series with each other and a series connection of resistors $R_{24}$ and $R_{24}'$ disposed in parallel with elements Pc and $R_{25}$. A connection point $d_2$ of the resistors $R_{24}$ and $R_{24}'$ is connected to the base of the transistor $Q_2$, the emitter of which is connected to the negative side of the power source serially through a variable resistor $R_{26}$ for setting the film sensitivity and the aperture value, and through a parallel connection of a resistor $R_{33}$ and a thermistor $R_{34}$. A connection point $d_3$ of the compound photoelectric element Pc and the resistor $R_{25}$ is connected to the contact $C_{p1}$ of a change-over switch $S_{22}$ and the base of a transistor $Q_7$. A contact $C_{p2}$ of the change-over switch $S_{22}$ is connected to the base of a transistor $Q_3$ and a common contact $C_{pc}$ of the switch $S_{22}$ is connected to one end of a memory capacitor $C_{21}$, the other end of which is connected to both of the positive and negative sides of the power source E through resistors $R_{27}$ and $R_{28}$ for bias voltage dropping purpose. The collector of the transistor $Q_3$ is connected to the positive side of the power source E through a capacitor $C_{22}$ and to the base of a transistor $Q_4$. A trigger switch $S_{24}$ is provided in parallel with the capacitor $C_{22}$. The emitter and collector of the transistor $Q_4$ are connected to the positive and negative sides of the power source E through resistors $R_{29}$ and $R_{30}$, respectively. The transistors $Q_4$, $Q_5$ and $Q_6$ constitute a Schmidt circuit. An electromagnetic coil M is inserted between the collector of the transistor $Q_6$ and the positive side of the power source E; the Schmidt circuit and the electromagnetic coil M are supplied with electric power through the power source switch $S_{21}$ and a main switch $S_{23}$. The collector of a transistor $Q_7$ having its base connected to the contact $C_{p1}$ of the change-over switch $S_{22}$ is connected to the negative side of the power source E, and the emitter of transistor $Q_7$ is connected through a resistor $R_{31}$ to the collector of a transistor $Q_8$, whose emitter circuit and collector is connected in series to an ammeter $A_p$. A temperature compensation diode $D_{21}$ is connected in forward direction between the emitter of the transistor $Q_7$ and the base of the transistor $Q_8$, which is connected to the negative side of the power source E through a resistor $R_{32}$.

As shown in FIG. 2, the compound photoelectric element Pc is comprised of a series connection of a photoelectric element Pc1 and a resistor Rx, and a photoelectric element Pc2 connected in parallel therewith. Upon closing the contact $C_{p1}$ of the change-over switch $S_{22}$, the compound photoelectric element Pc begins its light measuring operation, by which a light measuring output voltage proportional to the logarithmic value of the illumination on the light receiving face of the element Pc is stored in the memory capacitor $C_{21}$. The stored voltage is subjected to anti-logarithmic conversion by the transistor $Q_3$. The capacitor $C_{22}$ connected to the collector of the transistor $Q_3$ is charged with a constant current proportional to the illumination on the light receiving face of the photoelectric element Pc, when the trigger switch $S_{24}$ is opened simultaneously with the opening of the shutter to commence the exposure interval. By the way, the main switch $S_{23}$ is adapted to be closed after the contact $C_{p1}$ of the change-over switch $S_{22}$ has been opened and, upon closing of the main switch $S_{23}$, the transistors $Q_5$ and $Q_6$ of the Schmidt circuit conduct to excite the electromagnetic coil M to prevent the shutter from closing. Upon opening of the shutter, the trigger switch $S_{24}$ is opened as mentioned above and the constant current proportional to the illumination on the light receiving face of the compound photoelectric element Pc begins to flow in the capacitor $C_{22}$ to charge it. When the charging voltage of capacitor $C_{22}$ has reached the trigger level of the Schmidt circuit, the transistor $Q_4$ reverses into its conductive or on state, and the transistors $Q_5$ and $Q_6$ are turned off to stop the excitation of the electromagnetic coil M, so that the shutter is released to close and to terminate the exposure interval. The potential appearing at the contact $C_{p1}$ while light is being measured is amplified by the transistors $Q_7$ and $Q_8$ and impressed to the ammeter $A_p$ to indicate the time exposure thereon. Thus, the constant current charged in the capacitor $C_{22}$ is proportional to the illumination of light incident on the light receiving face of the compound photoelectric element Pc immediately before the shutter operation, providing proper exposure time corresponding to the brightness of the object illumination. The photoelectric elements Pc1 and Pc2 making up the compound photoelectric element Pc have such characteristics to provide the logarithmic value of the illumination incident on the light receiving face, as depicted in FIG. 3. Since the resistor Rx has a resistance value shown in FIG. 3, the compound photosensitive element Pc has such a characteristic as a whole, as indicated by curve Pc. The relationship between the potential (V) at the connection point $d_3$ of the series connection of the compound photoelectric element Pc having such characteristic and the resistor $R_{25}$, and the illumination on its light receiving face is logarithmically expressed as depicted in FIG. 4, in which it varies by $V_o$ with each change (1EV) in the illumination on the light receiving face of element Pc, and can also be shifted in parallel by changing the resistance value of the film sensitivity and aperture value changing variable resistor $R_{26}$. With the device described above, it is possible to attain the object fairly satisfactorily. In general, however, in the case of a single lens reflex camera, it is necessary to effect the memorization of the light value before the actuation of the mirror, and a time of about 30 milliseconds is required until the shutter opens after the actuation of the mirror. In the circuit of FIG. 1 previously proposed by the present applicant, the change-over switch $S_{22}$ is connected to the contact $C_{p2}$ before the actuation of the shutter, by which the transistor $Q_3$ is made conductive and the charge stored in the memory capacitor $C_{21}$ is discharged as a base current of the transistor $Q_3$. Therefore, as described above, in the case where the illumination on the light receiving face of the light receiving element Pc is stored in a logarithmically compressed form and the stored voltage is logarithmically expanded to control the exposure time, it is possible to store the illumination incident on the light receiving face over a wide range of the brightness of the on the other hand, in the process of the logarithmic expansion of the stored voltage a noticeable error occurs in the time of exposure. In particular, a change in the stored voltage exerts a great influence on the exposure time in the case of a high-speed shutter operation. Such a defect can be overcome by the additional provision of a switching circuit, but this method necessitates extremely complicated mechanical and electrical constructions for properly opening and closing the switch in association with the shutter operation and so on.

This invention is directed to improvements in the above-described exposure time control device previously proposed by the present applicant. In this invention, the part corresponding to the memory capacitor described previously is replaced with a known A-D converter circuit. Namely, the A-D converter circuit is composed mainly of a clock pulse generator circuit, a binary counter, a resistance network for the D-A conversion of the content of the binary counter and a voltage comparator circuit for comparing an input voltage for digital conversion with a voltage appearing at the output of the resistance network. The desired object can easily be attained by the employment of such an A-D conversion circuit.

With reference to the drawings, this invention will hereinafter be described in detail.

FIG. 5A is a circuit diagram illustrating one example of this invention. A broken-line block A is a light measuring circuit, which generates a first voltage in proportion to the logarithm of the brightness or intensity of an object illumination, sets a second voltage corresponding to the film sensitivity and the aperture value, and derives an output indicative of the sum of the first and second voltages. In this light measuring circuit A, a series connection of resistors $R_9$ and $R_{10}$ and a series connection of a photoelectric element Pc and a resistor $R_{11}$ connected in parallel with the elements $R_9$ and $R_{10}$, are inserted between a constant-current power source $I_1$ and the collector of a transistor $Tr_1$; the connection point of the resistors $R_9$ and $R_{10}$ is connected to the base of the transistor $Tr_1$; and the emitter of the transistor $Tr_1$ is grounded through a variable resistor $R_{12}$ for changing the film sensitivity and the aperture value. The light measuring circuit A is exactly identical in operation with the device shown in FIG. 1.

In the light measuring circuit A, reference characters $R_9$, $R_{10}$ and $R_{11}$ designate resistors; Pc refers to a light receiving element whose resistance value varies with the intensity of incident light received from the object; $Tr_1$ indicates a transistor; $R_{12}$ refers to a variable resistor whose resistance value varies with the film sensitivity and the aperture value to insert the information of the film sensitivity and the aperture value in the output voltage from the light measuring circuit A; $I_1$ identifies a constant-current power source; and a refers to an output terminal. The intensity of the light from the object, received by the light receiving element Pc, is indicated at the output terminal a as a voltage proportional to the logarithm of the brightness of the object illumination. Namely, the information given a camera at the time of photographing is the brightness of the object illumination, the aperture value of a camera lens, and the sensitivity of a film used. The variation of these input values are exponential such as: 1, 2, 4, . . . luxes in the case of the brightness of the object illumination; 1.4, 2, 2.8, 4, . . . in the case of the aperture value; and ASA 25, 50, 100, . . . in the case of the film sensitivity.

Accordingly, if these variations are used as the output from the light measuring circuit A, the output also varies exponentially. For example, if the range of the exposure time is selected to be 1 to 1/1000 sec. and if the output voltage from the light measuring circuit A is 0.1 volt per second, the output voltage becomes as high as 100 volts per 1/100 sec. and a very large power source is required. Namely, it is extremely difficult in practice to handle the light measuring output voltage as an exponentially varying one. Further, if a low voltage power source is employed for avoiding this difficulty, the result is the lowering of the accuracy of the circuit output.

The light measuring circuit A employs as the light receiving element Pc such a compound photoelectric element as depicted in FIG. 2. Namely, the compound photoelectric element Pc comprises a series connection of a high sensitivity photoelectric element $Pc_1$ and a resistor $r_x$, and a low sensitivity photoelectric element $Pc_2$ which connected in parallel to the series connection of elements $Pc_1$ and $r_x$. The logarithm of the composite resistance value has a wide range of linearity with respect to the logarithmic value of the received light, as shown in FIG. 3.

It is also possible to combine two of such compound photoelectric elements in a pair as illustrated in FIG. 5B. Namely, photoelectric element $CdS_{11}$ and $CdS_{12}$ having a higher sensitivity to incident light, i.e. presenting a lower resistance, of the two compound photoelectric elements are interconnected through a half-fixed resistor $Vrs_1$, and a series connection of photoelectric elements $CdS_{01}$ and $CdS_{02}$ having a lower sensitivity to incident light (i.e. providing a higher resistance) is connected in parallel with the above series connection. A half-fixed resistor $Vrs_2$ is connected in series to the above-described parallel connection. The two compound photoelectric elements are disposed in a finder light-path system of the camera (for example, at the front and rear ends of a roof-shaped reflecting plane of a pentagonal prism) so that they may provide a light measuring system of an image of the object while dividing the image into two. The resistance values of the half-fixed resistors $Vrs_1$ and $Vrs_2$ are set by adjustment, by which is derived from the half-fixed resistor $Vrs_2$ an output voltage which varies in the manner of the arithmetic series with the brightness of the object varying in the geometric series. This is commonly referred to as a CLC effect which provides photographically good results. The resistor $R_{11}$ in the example of FIG. 5A corresponds to the half-fixed resistor $Vrs_2$ whose resistance value is set by adjustment.

In this kind of camera, during exposure, the mirror jumps up to intercept the light being measured, so that a light measuring voltage corresponding to the brightness of the object illumination before the mirror jumps up is charged and stored in a capacitor, whereby the exposure time is automatically controlled based on the stored voltage. The output terminal a of the light measuring circuit A is connected to a memory capacitor (not shown) and a voltage comparator circuit Com described hereinbelow. In general, the brightness of the object illumination varies over a wide range, so that, in the light measuring circuit A, a voltage proportional to the logarithm of the brightness of the object illumination is produced as a light measuring voltage and is stored to be used for the exposure control. As a result, the power source voltage may be as low as several volts.

The comparator circuit 10 is a voltage comparator circuit formed with a differential switching circuit which receives at its one input the output, i.e. a first voltage or signal, from the light measuring circuit A appearing at the terminal a and at the other input, i.e. a second voltage or signal, the output at a terminal b derived from a resistance network described later. The comparator circuit 10 derives therefrom a pulse at a terminal c when the level of the second voltage exceeds that of the first voltage. Reference numeral 12 indicates a one-shot circuit formed with a monostable multivibrator, which, when supplied with the pulse from the voltage comparator circuit 10, supplies a voltage signal of high level to an OR gate circuit 14 subsequent thereto for a predetermined period of time. Reference numeral 16 designates an AND circuit, which derives an output voltage of high level when its input terminals $X_1$ and $Y_1$ are both at high level. Reference numeral 18 identifies a flip-flop circuit having a reset terminal Z, which is adapted to be reversed when the output from the AND gate circuit 16 changes from a low level to a higher one. The OR gate circuit 14 supplies a voltage of high level to an input terminal $X_3$ of a gate circuit 20 subsequent thereto when at least either one of input terminals $X_2$ and $Y_2$ is at a high level. Reference numeral 22 represents a clock pulse generator circuit, whose output is applied to the input terminal $Y_3$ of the gate circuit 20. The gate circuit 20 inhibits the passage therethrough of the pulse from the clock pulse generator circuit 22 when the output terminal $X_3$ is at a high level and which permits the passage therethrough of the pulse from the pulse generator circuit 22 to be applied to a flip-flop circuit $F_1$ which constitutes a first stage of a binary counter. Reference characters $F_1$ to $F_4$ designate flip-flop circuits, which makes up a binary counter 24 and whose outputs are connected to a decoder 26 and to one end of each of resistors $R_1$ to $R_4$. Reference characters $R_0$ to $R_5$ identify resistors, which form a resistance network 28 for converting the content of the binary counter 24 into an analog voltage. Reference character b' indicates an output terminal of the resistance network 28. The decoder 26 converts the code of the content of the binary counter 24 to provide a digital indication of the content of the binary counter 24 on a display unit 30. Reference characters $R_7$ and $R_8$ identify resistors, which divide the power source voltage +V. Reference character $SW_1$ indicates a switch, which is opened and closed in ganged relation to a shutter button (not shown) and which is adapted to be normally closed, opened before rising of the mirror when the shutter button is depressed, and closed when the mirror is returned to its lowered position. Reference character $Tr_3$ denotes a transistor, which serves to convert, in cooperation with a resistor R6, the output impedance of the resistance network 28 formed of the resistors $R_0$ to $R_5$ and which is of an emitter follower construction for lowering its impedance. Where light of constant intensity shines on the photoelectric element Pc of the light measuring circuit A, the potential at the terminal a lowers with an increase in the ambient temperature and if the base potential of the transistor $Tr_3$ is constant, its emitter potential lowers with the rise of the ambient temperature, so that the transistor $Tr_3$ functions to effect temperature compensation for the photoelectric element Pc.

A broken-line block B is a shutter control circuit comprising a transistor $Tr_2$ which has its base connected to the terminal b of the voltage comparator circuit Com and its collector connected to a capacitor Co, a switching circuit S, and a switch $SW_2$ connected in parallel with the capacitor Co. The emitter of the transistor $Tr_2$ is grounded through a switch $SW_3$. In the shutter control circuit B, the capacitor Co is charged with a collector current of the transistor $Tr_2$, which is proportional to the exponent of a voltage applied between the base and emitter of the transistor $Tr_2$. When the charging voltage of capacitor Co has reached a predetermined level, the switching circuit S operates to close the shutter thereby terminating the exposure interval. This operation is exactly the same as that of the device depicted in FIG. 1. Reference characters Q and $\overline{Q}$ designate outputs from the flip-flop circuits as is well known.

Figure 6:
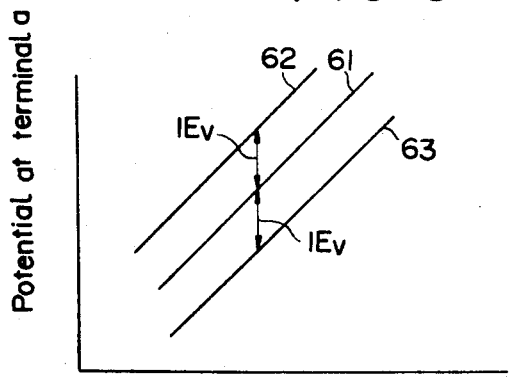
FIG. 6 is a graph showing the relationship between the potential at a terminal a in FIG. 5A and the brightness of an object to be photographed.

With such a construction, in the actual photographing, the variable resistor $R_{12}$ of the light measuring circuit A is adjusted in accordance with the film sensitivity and the aperture value, thereby to set the emitter potential of the transistor $Tr_1$. Accordingly, the potential at the terminal a, which is the output of the light measuring circuit A, varies with not only a change in the brightness of the object but also a change in the resistance value of the variable resistor $R_{12}$; this relation is such as shown in FIG. 6, the ordinate representing the potential at the terminal a and the abscissa the logarithm of the brightness of the object illumination. Lines 62 and 63 on both sides of a line 61 correspond to a change 1EV in the film sensitivity and the aperture value. Assuming that the switch $SW_1$ is closed, the reset termial Z of the flip-flop circit 18 and the input terminal $Y_1$ of the 16 gate circuit AND is at a low level (hereinafter identified by "0") and the output Q of the flip-flop circuit 18 is "0" and does not take part in the closing operation of the gate circuit 20 through the OR gate circuit 14. Consequently, a clock pulse is applied from the clock pulse generator circuit 22 to the binary counter 24 through the gate circuit 20. For the sake of simplicity, the following description will begin with the instant when the outputs Q from the flip-flop circuits $F_1$ to $F_4$ are all "0", that is, the instant tO in FIG. 7. FIG. 7 is a time chart, for explaining the operation of each part of the device, FIG. 7A showing the relation between the aforementioned first and second voltages or signals to be compared by the voltage comparator circuit 10, FIG. 7B illustrating the output from the voltage comparator circuit 10, FIG. 7C referring to the output the oneshot circuit 12 and FIG. 7D showing the clock pulse to be applied to the binary counter 24, and the ordinate representing potential and the abscissa time. Where the outputs Q from the flip-flop circuits $F_1$ to $F_4$ are all "0", the resistance network 28 comprising the resistors $R_0$ to $R_5$ is supplied with a current from a voltage power source $+V'$ through the resistor $R_5$ and the voltage level of the voltage comparator circuit 10 at the terminal b is $V_0$ as depicted in FIG. 7A. Then, upon application of the pulse to the binary counter 24, only the output Q from the flip-flop circuit $F_1$ becomes "1", permitting a current supply to the resistance network Rc through the resistors $R_5$ and $R_1$. Thereafter, the pulse is sequentially counted in known manner and the resistors $R_1$ to $R_4$ are selected correspondingly, through which a current is supplied to the resistance network 28. In this case, if the values of the resistors $R_1$ to $R_4$ are selected to bear the following relation as indicated in equation (1), the voltage appearing at the terminal b' takes a stairstep waveform. Accordingly, the voltage at the terminal b changes in a stairstep manner correspondingly. Namely, $$R_1 = 2R_2 = 4R_3 = 8R_4 \tag{1}$$

$$\frac{V}{15 + \frac{R_1(R_0 + R_5)}{R_0 R_5}} = \Delta V \tag{2}$$

$$\frac{R_1 V \Delta V}{R_5 V} = V_0 \tag{3}$$

where $R_0$ to $R_5$ resistance values of the resistors $R_0$ to $R_5$

V represents the voltage appearing at the output Q when the outputs Q from the flip-flop circuits are "1", $\Delta V'$ represents the voltage of one step of the stairstep waveform appearing at the terminal b', V' represents the voltage applied to one end of the resistor $R_5$, $V'_0$ represents the voltage at the terminal b' when the outputs Q from the flip-flop circuits are all "0", Refer to FIG. 5A to show the terminal b'. These equations (1), (2) and (3) can be obtained by the application of the Millman's theorem in a well-known manner.

In the present example, the output from the binary counter 24 has sixteen states, and hence its waveform has fifteen steps. FIG. 7A shows the potential at the terminal b, that is, the stairstep waveform of the aforesaid second voltage, and the potential $V_0$ in FIG. 7A corresponds to the level of the potential $V'_0$ at the terminal b'. In this example, since the number of the flip-flop circuits in the binary counter 24 is four, the second voltage has a stairstep waveform of fifteen steps and the shutter time has fifteen stages in terms of 1EV. The number of the flip-flop circuits can be easily increased and, in the case of using five flip-flop circuits, the shutter time is set in terms of ½EV and, in the case of six flip-flop circuits, it is set in terms of ¼EV.

Assuming that the level of the potential at the terminal a, that is, the first voltage, is Vi in FIG. 7A and that the second voltage has reached Vi at an instant $t_1$, the voltage comparator circuit 10 derives at its output terminal "c" a pulse depicted in FIG. 7B. The oneshot circuit 12 is supplied with the pulse from the voltage comparator circuit 10 to supply the OR gate circuit 14 with such a signal of "1" as depicted in FIG. 7C. Then, the signal of "1" is applied to the input terminal $X_3$ of the gate circuit 20 from the OR gate circuit 14 to close the gate circuit 20 and hence, to inhibit the passage therethrough of a pulse. While the gate circuit 20 is closed, the state of the binary counter 24 remains unchanged, so that the potential at the terminal b is also held constant. However, when the output from the one-shot circuit 12 becomes "0" at the instant $t_2$, the gate of the gate circuit 20 is opened to permit the passage therethrough of the pulse to the binary counter 24 and, as a result of this, the second voltage begins to change in a stairstep manner again. When counting has advanced and all of the outputs Q from the flip-flop circuits $F_1$ to $F_4$ have become "1", the second voltage reaches its maximum value and, upon impression of the next pulse, returns to its initial level of a minimum potential $V_0$. This takes place at an instant $t_3$ in FIG. 7A. Thereafter, the above operation is repeated so long as the switch SW, is closed and this operation is related to the indication of the shutter time described later.

As depicted in FIG. 7, in a period T from the instant $t_1$ to $t_2$ during which the oneshot circuit 12 is operative, the content of the binary counter 24 is maintained and, it is arranged that, at the time of actuating the shutter, the content of the binary counter 24 is retained by closing the gate circuit 20 until the mirror of the camera is lowered to its predetermined position after its rising and is stored in a digital form. Upon depression of the shutter buttom, the switch $SW_1$ is opened and the potential at the input terminal $Y_1$ of the AND gate circuit 16 becomes "1". Since the potential at the reset terminl Z of the flip-flop circuit 18 is "0" before the switch $SW_1$ is opened, the flip-flop circuit 18 is reset and its output Q remains "0". Under such condition, upon application of a signal of "1" to the input terminal $X_1$ of the AND gate circuit 16 from the comparator circuit 10 a signal of "1" is derived from the AND gate circuit 16 and applied to the flip-flop circuit 18 to reverse it, with the result that the output Q from the flip-flop circuit 18 becomes "1" and the output from the OR gate circuit 14 also becomes "1". Consequently, the gate circuit 20 is closed to inhibit the passage therethrough of the pulse from the clock pulse generator circuit 22, so that the binary counter 24 is retained in its holding state and, at the terminal b, a second voltage equal to the first voltage is obtained and the aforesaid digital storage is carried out.

The time necessary for storing the first voltage after the opening of the switch $SW_1$ is 1 millisecond or less as will be described later. It is sufficiently possible that, in the shutter button pushing-up operation, the time until the mirror begins to rise after the opening of the switch $SW_1$ is set to be longer than 1 millisecond and there is no possibility of the mirror beginning to rise before the digital storage is achieved. Upon returning of the mirror to its perdetermined position again after completion of exposure, the switch $SW_1$ is properly closed by known means. Thus, the potentials at the input terminal $Y_1$ of the AND gate circuit 16 and the reset terminal Z of the flip-flop circuit 18 become "0⇌, the AND gate circuit 16 is closed and the output Q from the flip-flop circuit 18 is reset at "0".

While, in the shutter control circuit B, the switch $SW_2$ is opened in ganged relation to the depression of the shutter button before the shutter is opened and then, upon opening of the shutter, the switch $SW_3$ in the clutter control circuiB is closed. Then, the second voltage corresponding to the content retained in the binary counter 24 is impressed between the base and emitter of the transistor $TR_2$ to provide a flow of collector current proportional to the exponent of the second voltage to its collector and the capacitor $C_0$ is charged with the collector current. When the charging voltage of the capacitor $C_0$ has reached a predetermined level, the switching circit S operates to actuate a shutter closing mechanism (not shown), thus completing the operation of exposure and terminating the exposure interval.

Figure 8:
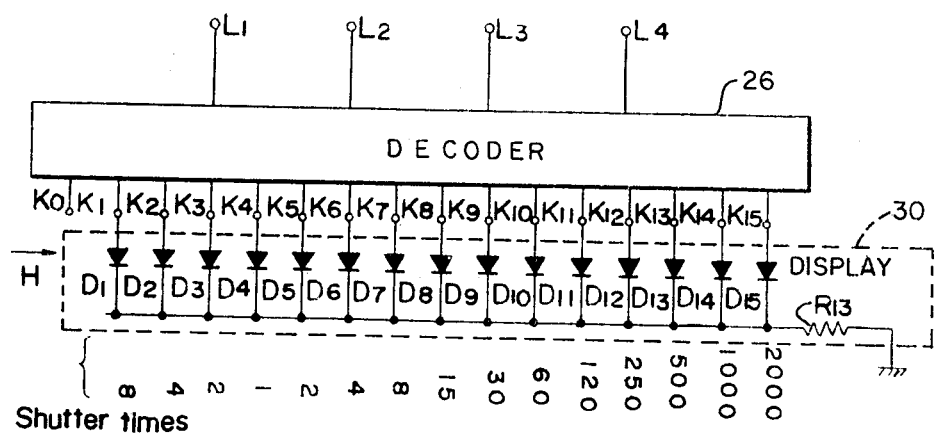
FIG. 8 is an electric circuit diagram, for explaining in detail an indicator unit in FIG. 5A.

Further, the output from the binary counter 24 is also applied to the decoder 26, in which the content of the binary counter 24 is converted into a different code to provide a signal for the display unit 30. FIG. 8 illustrates one exemplary embodiment of each of the decoder 26 and the display unit 30, in which the construction of the decoder 26 is a known one. The decoder 26 has input terminals $L_1$ to $L_4$ for the connection with the binary counter 24 and output terminals $K_0$ to $K_{15}$. The output terminals $K_0$ to $K_{15}$ are designed so that any one of them becomes "1" at one time and the others remain at "0". Namely, the output terminal which derives therefrom a signal "1" is shifted one by one in a direction of the arrow upon every impression of a pulse and after the operation has been shifted to the output terminal $K_{15}$, the operation is returned to the terminal $K_0$. The output terminals $K_1$ to $K_{15}$ are connected to luminescent diodes $D_1$ to $D_{15}$ respectively and a current flowing in the diodes $D_1$ to $D_{15}$ is controlled by a resistor $R_{13}$. The luminescent diodes $D_1$ to $D_{15}$ are a specified provided to correspond to a specified shutter time. For example, as depicted in FIG. 8, the luminescent diode $D_1$ is caused to indicate 8 sec. and the luminescent diode $D_{15}$ is caused to indicate 1/2000 sec. and the other diodes therebetween are arranged to indicate proper intermediate shutter times. Needless to say, the indicator members are not limited specifically to the luminescent diodes and may be numeral indicator tubes or other elements.

Assuming that the switch $SW_1$ is closed, the AND gate circuit 16 and the flip-flop circuit 18 are both inoperative and the operation described previously with regard to FIG. 7A is repeated. At the instant $T_0$, the outputs Q from the binary counter 24 are all "0" and, at this time, the potential at the output terminal $K_O$ of the decoder 26 becomes "1". The connection of a luminescent diode to the output terminal $K_O$ is insignificant. Then, upon impression of a pulse to the binary counter 24, the potential at the output terminal $K_1$ becomes "1" to cause the luminescent diode $D_1$ to emit light for a period of time $T_O$ which is one cycle of the pulse. Thereafter, the diode which emits light is shifted in the order of $D_2$, $D_3$, ... at every impression of the pulse. At the instant $t_1$, counting of the pulse is temporarily stopped, so that, in the example of FIG. 8, the luminescent diode $D_5$ emits light for a period of time $T_1$. Then, at the instant $t_2$ counting of the pulse is resumed and the diode radiation is shifted to the luminescent diodes $D_6$, $D_7$, ... one after another. Consequently, at any instant, any one of the luminescent diode emits light. However, if it is selected such that $T_O << T_1$, if the time $T_1$ is selected to be about 100 times as long as $T_O$, if the time $T_O$ is selected to be about 10μsec. (the frequency of the pulses being 100 KHz) and if the current to the luminescent diodes is adjusted correspondingly, the display appears to human eyes as if it is provided only by the lighting of the luminescent diode $D_5$. In this case, the time from the instant $t_0$ to $t_3$, that is, the scanning time, is about 1 millisecond and the first voltage is stored in the binary counter 24 for a maximum period of about 1 millisecond from the moment of the opening of the switch $SW_1$ following the depression of the shutter button even where the shutter button is depressed in a moment, the first voltage is stored without fail and the scanning time can be further shortened.

Figure 9:
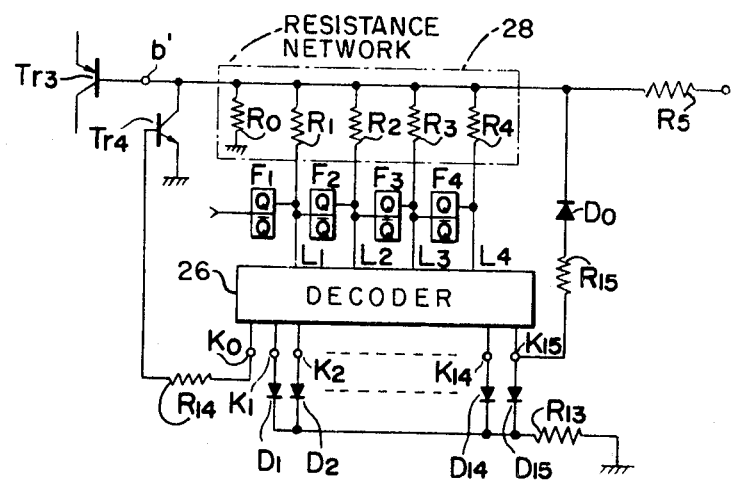
FIG. 9 is an electric circuit diagram of the principal part of another example of this invention.

FIG. 9 is a circuit diagram showing the principal part of another illustrative embodiment of this invention, which employs a circuit of a transistor $Tr_4$ and a resistor $R_{14}$ and a circuit of a diode $D_O$ and a resistor $R_{15}$ in addition to the circuit of the FIG. 5A embodiment. Since the other parts are the same as those in FIG. 5A, they are identified by the same reference characters and no detailed description will be repeated with regard to them. In the illustrated example, the output terminal $K_O$ of the decoder 26 is connected through the resistor $R_{14}$ to the base of the transistor $Tr_4$, the collector of which is connected to the output terminal b' of the resistance network 28 and the emitter of which is grounded. The final output terminal $K_{15}$ of the decoder 26 is connected to the terminal b' through the resistor $R_{15}$ and the diode $D_O$. In this example, when the potential at the output terminal $K_O$ of the decoder 26 is "1", the base of the transistor $Tr_4$ is biased in a forward direction and the collector potential becomes substantially equal to the ground potential. This corresponds to the potential $V_O'$ at the instant $t_0$ in FIG. 7A and, by such operation, the luminescent diode $D_1$ is lighted when the first voltage is Vi'. In the absence of the circuit of the transistor $Tr_4$, no luminescent diode emits light in response to the first voltage Vi'. Further, when the potential at the final output terminal $K_{15}$ is "1", the potential at the terminal b' is further raised from its intrinsic level and the second voltage has a level V'max as shown in FIG. 7A, by which, where the level of the first voltage is Vi", the luminescent diode $D_{15}$ can be lighted. If the circuit of the diode $D_O$ is not provided, the luminescent diode does not emit light. Therefore, the luminescent diodes $D_1$ and $D_{15}$ in the FIG. 9 example can be utilized for the indication that the brightness of the object falls outside of a normal control range.

As described previously, the potential at the terminal a varies with a rise of the ambient temperature of the CdS photoelectric elements, while the potential at the terminal B' corresponds to the content of the binary counter 24 regardless of temperature. Therefore, a direct comparison of the potentials at the terminals a and b' leads to different indications of the same brightness of the object according to temperature and the luminescent diode being lighted and consequently the shutter time being indicated may not be always accurate. In the present example, however, the transistor $Tr_3$ is inserted and the voltage between its base and emitter becomes lowered with a temperature rise, so that the potential change at the terminal a is compensated for, thus providing an accurate indication at all times.

Next, a description will be made in connection with examples of a exposure time indicator and a warning indicator of an automatic exposure setting camera which has been improved to indicate on the same indicator unit, the exposure time in a digital value and a warning that the brightness of the object is outside of the photographable range of the camera.

Figure 10:
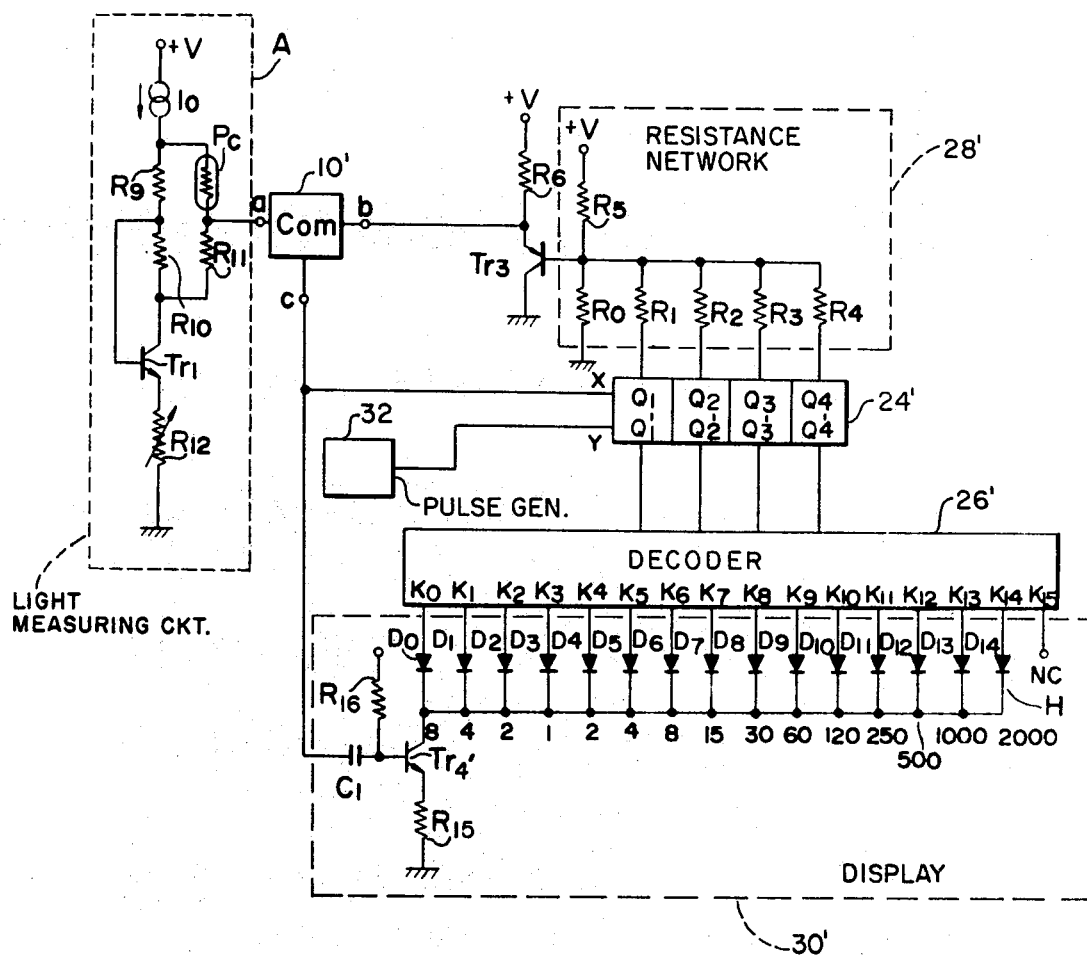
FIG. 10 is a circuit diagram of another example of this invention.

FIG. 10 illustrates another example of this invention, in which the light measuring circuit A is exactly identical with that shown in FIG. 5A and its construction and operation are the same as those described previously in connection with FIGS. 7B, 7C and 7D, so that no detailed description thereof will be repeated.

In FIG. 10, reference character 32 indicates a clock pulse generator circuit, which applies a pulse to an input terminal Y of a reversible binary counter B. Reference character B designates the reversible binary counter 24' as mentioned above, which, when a voltage of a high level (hereinafter identified by "1") is applied to its input terminal X, counts the pulse from the input terminal Y by addition and, when a voltage of a low level (hereinafter identified by "0") is applied to the input terminal X, counts the pulse derived from the clock pulse generator 32 and applied to the input terminal Y by subtraction. Reference characters $Q_1$ to $Q_4$ and $Q_1'$ to $Q_4'$ represent output terminals. The output terminals $Q_1$ and $Q_1'$, $Q_2$ and $Q_2'$, ... are in common to each other and sixteen counted states are derived from these output terminals.

Reference character 28' denotes a resistance network which comprises resistors $R_0$ to $R_6$ and a transistor $Tr_3$ and which converts the sixteen digital outputs from the counter 24' into sixteen analog to be applied between the base and emitter of the transistor $Tr_3$; in turn, transistor $Tr_3$ supplies them to the input terminal b of the voltage comparator Com.

Reference character 26' identifies a decoder, which converts the digital outputs, binary-coded by the counter 24', into outputs suitable for a display and whose output terminals $K_0$ to $K_{14}$ have connected thereto luminescent diodes $D_0$ to $D_{14}$ of the display unit 30'. In response to the content of the counter 24', the potential at any one of the output terminals $K_0$ to $K_{14}$ becomes "1" and those at the other remaining ones become "0". Further, when the outputs from the counter 24' are all "0", the potential at the output terminal $K_0$ becomes "1" and, upon every impression of a pulse, the state "1" is shifted in the order of the output terminals $K_1$, $K_2$, ... one after another. There is no need of connecting a luminescent diode to the output terminal $K_{15}$.

Reference character 30' indicates the aforementioned indicator circuit comprising the abovementioned luminescent diodes $D_0$ to $D_{14}$, a transistor $Tr_4$, resistors $R_{15}$ and $R_{16}$ and a capacitor $C_1$, in which the luminescent diodes $D_0$ to $D_{14}$ correspond to the shutter times respectively, that is, as shown in FIG. 10, the diode $D_1$ corresponds to 4 sec., ... and $D_{14}$ corresponds to 1/2000 sec. The indicator circuit 30' and the voltage comparator circuit 10 are coupled together by the capacitor $C_1$ in terms of AC. When the potential at an output terminal c of the voltage comparator circuit 10 changes from "1" to "0", the transistor $Tr_4'$ is made nonconductive for a period of time dependent upon the time constants of the capacitor $C_1$ and the resistor $R_{16}$. The resistor $R_{15}$ adjusts the emitter current of the transistor $Tr_4'$. The luminescent diodes $D_0$ $D_{14}$ has described above to correspond to the shutter time respectively but need not always be so and may be arranged to indicate, for example, time slots of the shutter time. Namely, the diode $D_0$ is adapted to correspond to a shutter time slot of 8 to 4 sec., the diode $D_1$ is adapted to correspond to a shutter time slot of 4 to 2 sec., .... In the present example, the shutter time can be easily indicated in the form of time slots at intervals of 2EV, 3EV and so on by changing the number of stages of the counter 24' and the circuit of the decoder 26'.

Figure 11:
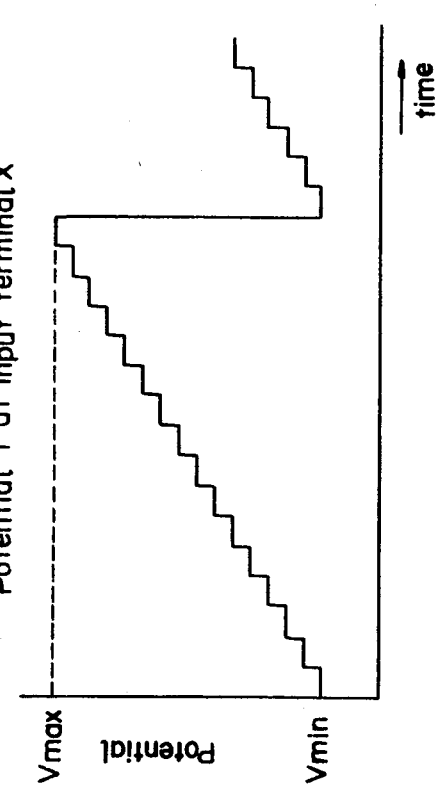

The operation of the example of FIG. 10, constructed as described above, will hereinbelow be described. To facilitate a better understanding of this example, a description will be given first of the clock pulse generator circuit 32, the counter 24' and the resistance network or D-A converter circuit 28'. In FIG. 11, there is illustrated how the output from the D-A converter circuit 28' varies in the case where counting of the pulse starts with the potentials at the output terminals $Q_1$ to $Q_4$ being all "0" and on the assumption that the potential at the input terminal X of the counter 24' is fixed at "1". In the FIG. 11, the abscissa represents time and the ordinate refers to the output level of the D-A converter circuit 28'. The circuit construction for generating a step form wave, which is formed with the clock pulse generator circuit 32, the counter 24' and the D-A converter circuit 28', is a known one and the values of the resistors $R_1$ to $R_4$ are selected to bear the following relation:

$$R_1 = 2R_2 = 4R_3 = 8R_4$$

Figure 12:
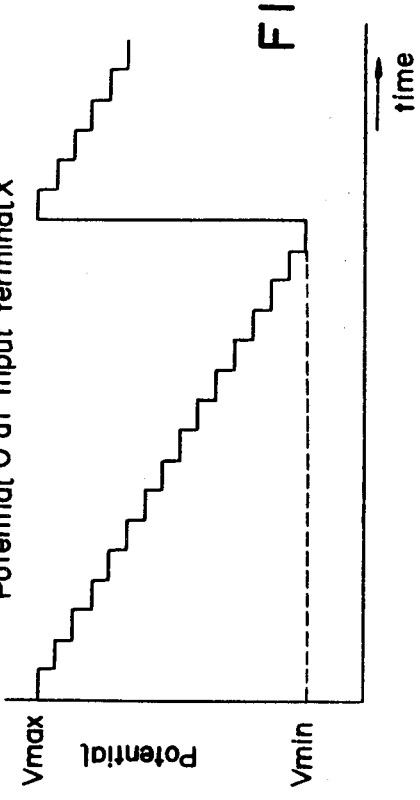

As shown in FIG. 11, the output level of the D-A converter circuit 28' rises in a stairstep manner at each counting of the pulse and, in this case, the counter 24' effects additive counting. Next, assume that the potential at the input terminal X of the counter 24' is "0". FIG. 12 shows the manner in which the output from the D-A converter circuit 28' changes where the counting of the pulse is started when the potentials at the output terminals $Q_1$ to $Q_4$ are all "1". In this case, the output level of the D-A converter circuit 28' lowers in a stairstep manner at each counting of the pulse and the counter 24' effects subtractive counting.

The following will describe the operations of the decoder 26' and the indicator circuit 30' in the above described condition where the potential at the input terminal X of the counter 24' is fixed at "1". Since the transistor $Tr_4$ is supplied with a forward bias by the resistor $R_{16}$, it is conductive. Accordingly, when the potentials at the output terminals $Q_1'$ to $Q_4'$ of the counter 24' are "0", the luminescent diode $D_O$ emits light and, thereafter, each time the pulse is applied to the counter 24', lighting is shifted to $D_1$, $D_2$, ... one after another. To human eyes, it appears as if the lighting point is being shifted. However, it is necessary to properly determine the period of the clock pulse generator circuit 32 and if the period of the pulse is too short, all the luminescent diodes appear as being lighted at the same time. In the case where the counting of the pulse is started when the potentials at the output terminals $Q_1'$ to $Q_4'$ are all "1" with the potential at the input terminal X of the counter B being fixed at "0", lighting of the luminescent diodes $D_0$, $D_1$, ... is shifted in a direction reverse to that described in the foregoing.

The present invention utilizes the sequential lighting of the luminescent diodes $D_0$, $D_1$, ..., that is, the flowing or shifting of the lighting point, as a warning indication.

Figure 13A:
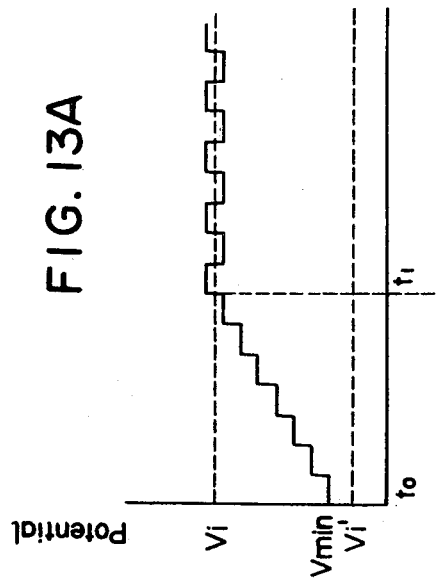
FIGS. 11, 12, 13A and 13B, inclusive, are diagrams, for explaining the operation of the example of FIG. 10.
Figure 13B:

Referring now to FIGS. 13A and 13B, the operations of the light measuring circuit A and the voltage comparator circuit 10 are explained. At the instant $t_0$ when a specified one of the luminescent diodes is lighted to indicate the shutter time in the case where the output voltage from the light measuring circuit A is Vi, the potential at the input terminal X of the counter 24' is "1" and, at this instant, the pulse is additively counted and the output from the D-A converter circuit 28' increases. At the instant $t_1$, the level at the one input terminal b of the voltage comparator 10 exceeds that Vi at the other input terminal a and the potential at its output terminal c changes to "0". Then, the next pulse is subtractively counted and the level at the input terminal b of the voltage comparator 10 lowers by one step, but, at this time, the potential at the output terminal c of the voltage comparator circuit 10 becomes "1". Thereafter, if the level of the output voltage Vi from the light measuring circuit A is constant, the level at the input terminal b goes above and below the level of the output voltage Vi at every impression of the pulse. In this case, two of the luminescent diodes, for example, $D_7$ and $D_8$, are alternately lighted. However, when the potential at the output terminal c of the voltage comparator circuit 10 changes from "1" to "0", the base of the transistor $Tr_4$ is reverse biased through the capacitor $C_1$, by which the transistor $Tr_4$ is made nonconductive for one period of the pulse and no current flows in the luminescent diode $D_8$, so that only the luminescent diode $D_7$ emits light, thereby indicating the shutter time of 1/8sec. Where the output voltage Vi from the light measuring circuit A is intermediate between Vmin and Vmax, either one of the luminescent diodes $D_7$ and $D_8$ is lighted to indicate the shutter time. However, in the case where the level at the input terminal a of the voltage comparator circuit Com is lower than Vmin as indicated by Vi', the potential at the input terminal X of the counter 24' is fixed at "1" and the indication becomes such that "the lighting point flows". In the case, the lighting point flows in the direction from the luminescent diode $D_0$ to $D_{14}$. Where the level at the input terminal a of the voltage comparator circuit 10 is higher than Vmax, the potential at the input terminal X of the counter 24' is "0" and the lighting point is displayed as if flowing in the direction from the luminescent diode $D_{14}$ to $D_0$.

Thus, a warning indication can be provided when the brightness of the object is outside of the exposure control range of the automatic exposure control device of the camera. In general, where constant light shines on the photoelectric element Pc, the potential at the output terminal a is lowered with a rise of the ambient temperature. While, the base potential of the transistor $Tr_3$ is at a level corresponding to the counted content of the counter 24'; but, this level is not dependent upon temperature. However, the voltage between the base and emitter of the transistor $Tr_3$ is lowered due to a temperature rise with respect to a constant current. Accordingly, even if the base potential of the transistor $Tr_3$ is constant, its emitter potential varies with temperature and is lowered with the temperature rise. In this manner, the levels at the input terminals a and b of the voltage comparator circuit 10 vary in the same direction, so that the light receiving element Pc is temperature compensated by the transistor $Tr_3$, and this is very convenient in practice.

Figure 14:
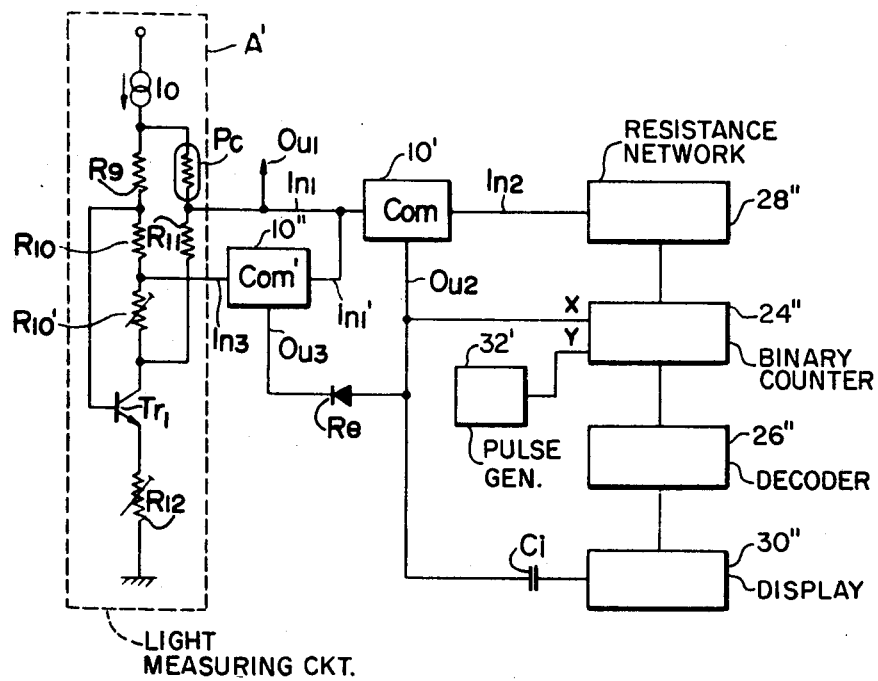
FIG. 14 illustrates still another example of this invention.

FIG. 14 is a circuit diagram illustrating another example of this invention, which is adapted to give a warning in the case where the quantity of light from the object received by the light receiving element Pc is below a certain level. Generally, the light receiving element has upper and lower sensitivity limits in its characteristic. Further, there are some occasions when the illumination on the light receiving face exists outside of its usable characteristic region. In such cases, lighting of the luminescent diodes for the shutter time indication is sequentially shifted to provide a warning indication in the form of the flowing or shifting of the lighting point, as is the case with the FIG. 10 embodiment. In the illustrated example, the same parts as those in FIG. 10 are marked with the same reference characters and no detailed description will be given in connection with them. This example is different from the FIG. 10 embodiment in that the light measuring circuit A' is different from A of FIG. 10, that a second voltage comparator circuit 10" different from the comparator circuit 10' is provided and that a diode Re interconnecting output terminals $Ou_3$ and $Ou_2$ of the voltage comparator circuits 10" and 10'.

In the light measuring circuit A', a resistor $R_{10}'$ is connected between one end of the resistor $R_{10}$ and the collector of the transistor $Tr_1$ and the connection point of the resistors $R_{10}$ and $R_{10}'$ is connected to an input terminal $In_3$ of the voltage comparator circuit 10'.

Where the level at an input terminal $In_1'$ of the voltage comparator circuit 10' is higher than that at the input terminal $In_3$, the level at its output terminal $Ou_3$ is "1", and where the levels at the above input terminals are opposite to those in the above case, the level at the output terminal $Ou_3$ is "0". When voltage level at the output terminal $Ou_3$ is "0", voltage level at the input terminal X, which is equal to that appearing at the output terminal $Ou_2$, is fixed at "0" through the diode Re. Then, regardless of change in the relation between the levels at the input terminals $In_1$ and $In_2$ of the voltage comparator circuit 10, the counter 24" repeats the subtractive counting and the lighting of the luminescent diodes in the indicator circuit 30" shifts as if flying at high speed.

The operation of the example of FIG. 14 will now be described. In the light measuring circuit A', a constant current is supplied to the connection point of the resistor $R_9$ and the light receiving element Pc from a constant current source $I_0$, while the resistance value of the series-connected circuit of the resistors $R_9$, $R_{10}$ and $R_{10}'$ is set to be sufficiently smaller than that of the series-connected circuit of the light receiving element Pc and the resistor $R_{11}$, so that the potential difference across the resistor $R_{10}'$ remains substantially constant irrespective of the illumination on the light receiving face of the light receiving element Pc. The potential difference across the resistor $R_{11}$ varies in such a relation as to be proportional to the logarithm of the illumination of the light received by the light receiving element Pc. Normally, the potential at the input terminal $In_1'$ is higher than that at the input terminal $In_3$, but when the illumination on the light receiving face of the light receiving element Pc is so low as to fall outside of the characteristic region in which the light receiving element Pc can be used, the potential at the input terminal $In_1'$ becomes lower than that at the input terminal $In_3$. In this case, the resistor $R_{10}'$ is adjusted appropriately. Further, a change in the resistance value of the variable resistor $R_{12}$ does not exert any influence on the potential difference between the input terminals $In_3$ and $In_1'$. Namely, the potential difference between the input terminals $In_3$ and $In_1$ is dependent only upon the illumination on the light receiving face of the light receiving element Pc.

Thus, where the illumination on the light receiving face of the light receiving element Pc is outside of the ganged operation range of the device, the level at the output terminal $Ou_3$ of the voltage comparator circuit 10' becomes "0" the level at the input terminal X of the counter 24" is fixed at "0" and the lighting of the luminescent diodes in the indicator circuit H is sequentially shifted to provide a warning indication. The description of this example has been given in connection with the provision of the warning indication that the shutter time is outside of the ganged operation range, as in the example of FIG. 10, and in particular, that the illumination on the light receiving face of the light receiving element is too low alternatively, by properly selecting the way of leading out the output terminal $Ou_3$ of the voltage comparator circuit 10' it is also possible to give a warning when the illumination on the light receiving face is too high to permit the ganged operation of the device.

As has been described in the foregoing, with the present invention, the frequency of the pulse produced by the pulse generator circuit may be constant, so that the pulse can be accurately applied over a wide range of the brightness of the object. Further, the photometric value is stored in a logarithmically compressed form and, in the case is reading out the stored voltage, of subjected to inverse logarithmic conversion, so that, even if the counter is of such a construction for counting The pulse of a constant frequency, the time for measuring the light is very short. Moreover, where the flip-flop circuits of the binary counter are four as in the foregoing examples, the second voltage to be compared with the first voltage in the voltage comparator circuit takes a stairstep waveform having fifteen steps and the shutter time is fifteen in terms of 1EV in the cases of five and six flip-flop circuits, the shutter time is set in terms of ½EV and ¼EV respectively and the number of the flip-flop circuits used is small as compared with the number of stages of the shutter time. In addition, the number of switches for actuating the device may be very small and the operation of resetting the binary counter is unnecessary and only one switch is required for the A-D conversion unit, i.e. $SW_1$. Further, since no meter is used for indicating the shutter time, the device of this invention well withstands shocks and in the case of employing luminescent diodes or the like, reading of the indication is possible at a dark place.

With the present invention, the lighting of the light emissive members for the shutter time indication is rapidly shifted to provide a noticeable warning indication where the shutter time is in a range outside of the operational limit of the camera, that is, where the conditions for photographing are outside of the ganged operation Range. For example, this invention provides a warning where in a camera which has a maximum highspeed shutter of up to 1/2000 sec., the shutter time for proper exposure is 1/4000 sec., or where the illumination on the light receiving face of the light receiving element is outside of the characteric range in which the light receiving element can be used. The lighting point as provided by energizing the light emissive members shifts in different directions in the cases of the additive counting and the subtractive counting. Thus, if the light shifting direction and the revolving direction of an aperture value setting ring (not shown) are associated with each other and the aperture value setting ring is revolved in the running direction of the lighting point, it is possible to stop the warning indication when the conditions for photographing come inside of the ganged operation range of the camera. Further, since the shutter time indication and the warning indication are both provided on the same indicator unit, parts can be saved and the indications can easily be recognized and interpreted in addition, since no parts susceptible to mechanical shocks such as a meter and the like are used, the device of this invention is quite durable.

It will be apparent that many modifications and variations may be effected without departing from the scope of the novel concepts of this invention.

I claim as my invention:

1. A digital indicator apparatus for a camera for providing a digital indication of intensity of scene brightness comprising:
   (a) means responsive to the intensity of scene brightness for producing a first analog signal representative thereof;
   (b) generator means for providing a train of clock pulses;
   (c) counter means for counting said clock pulses to provide successive digital count outputs, said counter means having a first mode responsive to an additive control signal to additively count said clock pulses and a second mode responsive to a subtractive control signal to subtractively count said clock pulses;
   (d) conversion means for converting said successive digital count outputs into a second analog signal of respectively corresponding values;
   (e) means for comparing said second analog signal with said first analog signal to produce said additive control signal for supply to said counter means when a first predetermined relationship exists between said first and second analog signals, and to produce said subtractive control signal for supply to said counter means when a second predetermined relationship opposite to said first relationship exists between said first and second analog signals;
   (f) indicating means having a plurality of indicator devices selectively energizable to indicate respectively corresponding digital count outputs of said counter means;
   (g) decoder means for selectively and sequentially energizing corresponding ones of said indicator devices in accordance with said digital count outputs of said counter means;
   (h) means responsive to a predetermined one of said additive and subtractive control signals of said comparing means for interrupting the energization of said indicator devices;

whereby only one of said indicator devices indicative of said first analog signal is energized to provide a digital indication of intensity of scene brightness;

further comprising a current supply path for energization of said indicator devices, and wherein said interrupting means comprises switching means connected in said current supply path, said switching means normally allowing a supply of current to said indicator devices therethrough and being responsive to said predetermined one of the additive and subtractive control signals; and wherein said switching means comprises a capacitor and a transistor having an emitter, a collector and a base, said transistor being connected with said emitter-collector conducting path in said current supply path and normally being maintained conductive, and said capacitor being connected to said base for applying said additive and subtractive control signals to said base, said predetermined one of the additive and subtractive control signals having a voltage level for rendering said transistor non-conductive.

2. A digital indicator apparatus as claimed in claim 1, wherein said conversion means comprises means for establishing predetermined minimum and maximum values for said second analog signal, said counter means cyclically counting said pulses in one of said first and second modes and said indicator devices thereby being sequentially energized cyclically in one direction when said first analog signal has a value outside of the range defined by said minimum and maximum values.

3. A digital indicator apparatus as claimed in claim 1, wherein said means responsive to the intensity of scene brightness produces said first analog signal with a value proportional to the logarithm of the intensity of scene brightness.

4. A digital indicator apparatus as claimed in claim 1 wherein said counter means is an up-down binary counter having an up-down control input for receiving said additive and subtractive control signals.

5. A digital indicator apparatus for a camera for providing a digital indication of intensity of scene brightness comprising:
(a) means responsive to the intensity of scene brightness for producing a first analog signal representative thereof;
(b) generator means for providing a train of clock pulses;
(c) counter means for counting said clock pulses to provide successive digital count outputs, said counter means having a first mode responsive to an additive control signal to additively count said clock pulses and a second mode responsive to a subtractive control signal to subtractively count said clock pulses;
(d) conversion means for converting said successive digital count outputs into a second analog signal of respectively corresponding values;
(e) means for comparing said second analog signal with said first analog signal to produce said additive control signal for supply to said counter means when a first predetermined relationship exists between said first and second analog signals, and to produce said subtractive control signal for supply to said counter means when a second predetermined relationship opposite to said first relationship exists between said first and second analog signals;
(f) indicating means having a plurality of indicator devices selectively energizable to indicate respectively corresponding digital count outputs of said counter means;
(g) decoder means for selectively and sequentially energizing corresponding ones of said indicator devices in accordance with said digital count outputs of said counter means;
(h) means responsive to a predetermined one of said additive and subtractive control signals of said comparing means for interrupting the energization of said indicator devices;

whereby only one of said indicator devices indicative of said first analog signal is energized to provide a digital indication of intensity of scene brightness, and said first analog signal producing means comprises a photoelectric element and means providing a reference analog signal independent of the level of illumination at said photoelectric element, said photoelectric element having a characteristic range in which it responds accurately to incident light; and there is further provided:

second comparing means for comparing said first analog signal with said reference analog signal to produce an output for supply to said counter means when a predetermined relationship exists between said first and reference analog signals, said counter means being responsive to said output of said second comparing means to be maintained in a predetermined one of said first and second modes irrespective of said additive and subtractive control signals.

* * * * *

UNITED STATES PATENT AND TRADEMARK OFFICE
CERTIFICATE OF CORRECTION

PATENT NO. : 4,132,985
DATED : January 2, 1979
INVENTOR(S) : MASHIO KITAURA

It is certified that error appears in the above-identified patent and that said Letters Patent are hereby corrected as shown below:

Abstract: line 9, (2nd Col.), "gennator" should be --generator--;

Col. 5, line 54, after "the" (second occurrence) insert --object but,--;

Col. 10, line 24, "oneshot" should be --one-shot--;

Col. 10, line 49, "oneshot" should be --one-shot--;

Col. 10, line 56, "buttom" should be --button--;

Col. 11, line 14, "perdetermined" should be --predetermined--;

Col. 11, line 25, "circuiB" should be --circuit B--;

Col. 11, line 34, "circit" should be --circuit--;

Col. 14, line 14, "$D_0$ $D_{14}$" should be --$D_0$ to $D_{14}$--;

Col. 17, line 45, "The" should be --the--.

Signed and Sealed this

Twenty-ninth Day of May 1979

[SEAL]

Attest:

RUTH C. MASON
*Attesting Officer*

DONALD W. BANNER
*Commissioner of Patents and Trademarks*

UNITED STATES PATENT AND TRADEMARK OFFICE
CERTIFICATE OF CORRECTION

PATENT NO. : 4,132,985
DATED : January 2, 1979
INVENTOR(S) : MASHIO KITAURA

It is certified that error appears in the above—identified patent and that said Letters Patent is hereby corrected as shown below:

Page 1, please insert the following:

--[30] Foreign Application Priority Data

August 3, 1972   Japan..........47-77847

August 3, 1972   Japan..........47-87476--.

Signed and Sealed this

Eighth Day of July 1980

[SEAL]

Attest:

SIDNEY A. DIAMOND

Attesting Officer

Commissioner of Patents and Trademarks